United States Patent

Widmer

[15] 3,653,989

[45] Apr. 4, 1972

[54] ZN DIFFUSION INTO GAP

[72] Inventor: Alois Erhard Widmer, Wuerenlos, Switzerland

[73] Assignee: RCA Corporation

[22] Filed: Apr. 2, 1970

[21] Appl. No.: 25,225

[52] U.S. Cl. ............................... 148/189, 148/186, 317/234

[51] Int. Cl. ............................... H01l 7/44

[58] Field of Search ............................... 148/189, 186

[56] References Cited

UNITED STATES PATENTS

| | | | |
|---|---|---|---|
| 3,484,854 | 12/1969 | Wolley | 148/189 X |
| 3,239,393 | 3/1966 | Dill, Jr. | 148/189 |
| 3,305,412 | 2/1967 | Pizzarello | 148/189 |
| 3,354,009 | 11/1967 | Mandel et al. | 148/189 |
| 3,573,114 | 3/1971 | Marinace | 148/189 |

*Primary Examiner*—L. Dewayne Rutledge
*Assistant Examiner*—G. K. White
*Attorney*—Glenn H. Bruestle

[57] ABSTRACT

Zinc is diffused into N type gallium phosphide to form a PN junction therein. The zinc diffusion takes place in vacuum at temperatures between about 800°–950° C. from a $ZnP_2$ source.

8 Claims, 6 Drawing Figures

INVENTOR.
Alois E. Widmer
BY
ATTORNEY

ZN DIFFUSION INTO GAP

BACKGROUND OF THE INVENTION

This invention relates to the formation of a PN junction in N type semiconducting gallium phosphide.

Gallium phosphide having a PN junction is useful, for example, as a light emitting diode. In the manufacture of light emitting diodes, zinc is diffused into N type gallium phosphide to form a PN junction therein. In the past, it has been difficult obtain a high quality smooth or regular junction. That is, a junction which is essentially free of sharp spikes. The junctions formed by prior art techniques are generally highly irregular as can be seen with reference to FIGS. 1–3. In order to obtain reproducible and uniform operating characteristics in the GaP junction devices, it is important to obtain a smooth or regular junction.

SUMMARY OF THE INVENTION

A method of diffusing zinc into the gallium phosphide by heating the GaP in the vapors produced from $ZnP_2$.

The process enables the formation of a GaP diode having a smooth PN junction, free of an intrinsic region, which is characterized by the function 1/C2 $\alpha$ V at low voltages and 1/C3 $\alpha$ V at higher voltages where C is the capacitance of the diode and V is the applied voltage.

DESCRIPTION OF THE PREFERRED EMBODIMENT

I have discovered that very smooth planar PN junctions can be formed in gallium phosphide by the diffusion of zinc into N type GaP from a $ZnP_2$ source.

Figure 1:
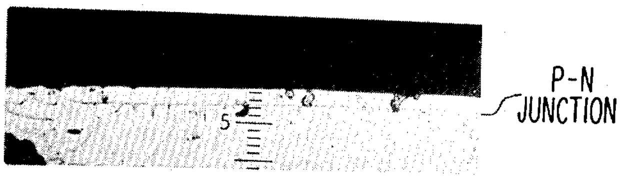
FIGS. 1–4 are photographs of PN junctions produced in GaP by zinc diffusion from various sources.
Figure 2:
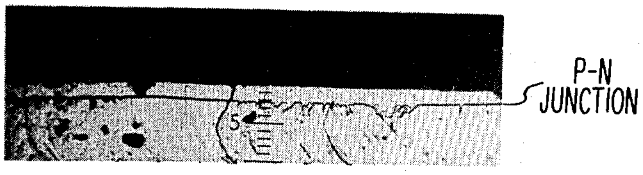
Figure 3:
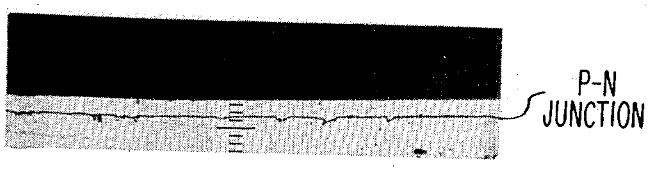
Figure 4:
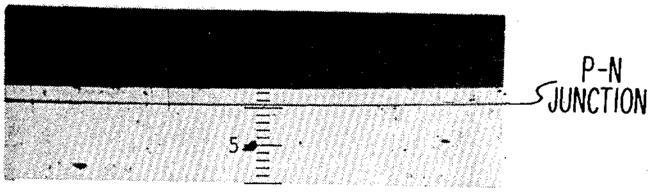

Referring to FIGS. 1–4 there is shown PN junctions produced by the diffusion of zinc into GaP from various sources of zinc. The junctions are made visible under strong illumination by etching a cleaved diode in a 1:1 etch solution of $H_2O_2$ and HF. The junction shown in FIG. 1 was produced by diffusing zinc from a pure zinc source at a concentration of 1 mg./cm.$^3$, at 800° C. for 2 hours. The concentration as expressed herein is the weight of the zinc source material divided by the volume of the ampoule in which the diffusion is carried out. The junction shown in FIG. 2 is the result of diffusion from a source consisting of Zn (1 mg./cm.$^3$) plus phosphorous (0.13 mg./cm.$^3$) at 800° C. for 2 hours. The junction shown in FIG. 3 is the result of diffusion from a source consisting of $Zn_3P_2$ (2 mg./cm.$^3$) at 850° C. for 2 hours. The junction shown in FIG. 4 is the result of diffusion from a source consisting of $ZnP_2$ (2 mg./cm.$^3$) at 850 PC for 2 hours.

It can readily be seen from these figures that only diffusion of Zn from the $ZnP_2$ source resulted in a highly smooth flat junction essentially free of irregularities.

The compound, $ZnP_2$, is known to exist in both a red tetragonal form and a black monoclinic form. Forms of the compound are equally suitable for use as a diffusion source since it is the chemical composition rather than the crystal structure of the compound which is of prime importance.

A typical GaP useful for producing the diodes is selenium doped N type material grown epitaxially on (100) crystallographically oriented GaAs substrates, such material can be grown by the hydride technique reported by Tietjen and Amick in the *Journal of the Electrochemical Society*, 113, 724, (1966). Alternatively, for example, one can use GaP doped with sulfur. The GaP can also be prepared by other growth techniques such as vapor or liquid phase epitaxy.

Prior to diffusion, the GaAs substrate is preferably removed from the GaP such as with a 5 percent aqueous solution of a 5:1 weight ratio mixture of NaOH and $H_2O_2$. The GaP is preferably etched prior to diffusion to provide a clean surface. This may be accomplished by etching for 1 minute at room temperature in a 2:1 solution of HCl and $HNO_3$. The GaP and $ZnP_2$ are then placed at different ends of a cleaned quartz ampoule. A vacuum of about $10^{-6}$ torr is provided within the ampoule.

The ampoule is then vacuum sealed. Typical diffusions are made at temperatures ranging from about 800°–950° C. for 1–9 hours depending upon the desired zinc concentration in the diode and the desired junction depth. In any event the temperature should be below the melting point of GaP. The amount of $ZnP_2$ used is based upon the volume of the ampoule and is typically about 2–6 mg./cm.$^3$, however, this is not critical. It is preferred to keep the temperature of the $ZnP_2$ lower then that of the GaP. For example, a temperature difference of about 5°–10° C. is suitable. After diffusion, the ampoule is preferably quick-cooled so that the material in the gas phase condenses on the source end of the ampoule.

No erosion of the GaP was observed for diffusions at temperatures between 800°–950° C. However, some color change of the GaP is noted in diffusions above about b 875° C. resulting in an opaque appearance. This is due to the high zinc concentrations obtained at these temperatures. Consequently, preferred diffusion temperatures are from 800°–875° C.

Figure 5:
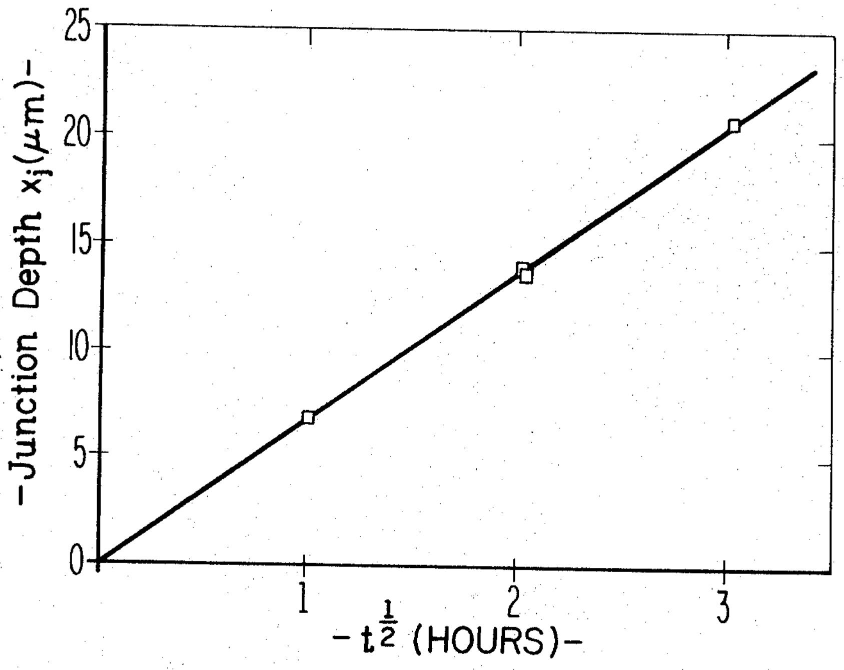
FIG. 5 is a graph showing the junction depth in GaP as a function of the square root of diffusion time of Zn from a $ZnP_2$ source at a temperature of 850° C.

The dependence of the diffusion depth as a function of the square root of time is shown in FIG. 5 for diffusions carried out at 850° C. The linear dependence shown indicates the process is readily controllable.

Figure 6:
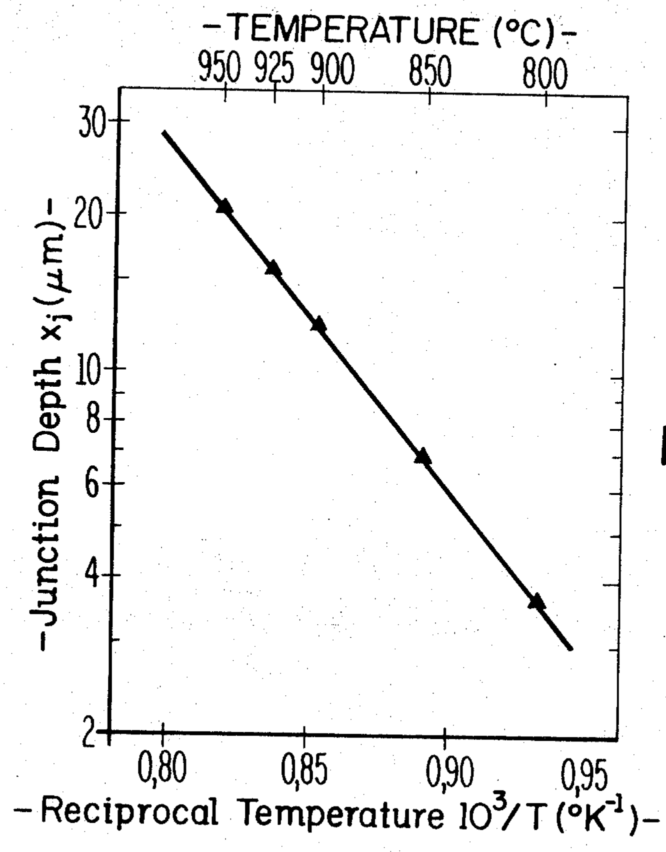
FIG. 6 is a semilogarithmic plot showing the junction depth in GaP as a function of diffusion temperature of Zn from a $ZnP_2$ source normalized for a 1 hour diffusion time.

A semilogarithmic plot of junction depth versus reciprocal temperature is shown in FIG. 6 normalized for 1 hour diffusion times. This indicates that the junction depth is also readily controllable and determinable by a variation in diffusion temperature.

Diodes having a step junction characteristic at a small reverse bias, that is, less than 2.5 volts and a linear graded junction characteristic at a higher reverse bias can be produced by the novel diffusion technique. In a step junction, the reciprocal of the square of the diode capacitance is proportional to the applied voltage. In a linearly graded junction the reciprocal of the cube of the capacitance is proportional to the bias voltage. In addition, no intrinsic layer is present in these diodes.

I claim:

1. A process for diffusing zinc into GaP comprising heating GaP in the vapors produced from $ZnP_2$.

2. A process for forming a PN junction in GaP comprising the step of diffusing zinc from a $ZnP_2$ source of zinc into N type GaP.

3. The process for forming a PN junction in GaP recited in claim 2 wherein said N type GaP and said $ZnP_2$ zinc source are heated together in an evacuated container.

4. A process for forming a PN junction in GaP comprising the steps of enclosing N type GaP and $ZnP_2$ in an evacuated chamber and heating said chamber to a temperature of between 800°–950° C. for a time sufficient for zinc to diffuse into said N type GaP so as to form a PN junction therein.

5. A process for forming a PN junction in GaP comprising the steps of enclosing N type GaP and $ZnP_2$ in an evacuated chamber, said N type GaP and said $ZnP_2$ being separated from each other, heating said chamber and its contents to a temperature below the melting point of said GaP but sufficient to diffuse zinc therein to form said junction, the temperature of said $ZnP_2$, being below the temperature of said GaP, and diffusing zinc into said GaP for a time sufficient to form a PN junction therein at any desired depth.

6. The process recited in claim 5 wherein the temperature of said GaP and $ZnP_2$ is from 800°–950° C.

7. The process recited in claim 5 wherein said evacuated chamber is at a pressure of about $10^{-6}$ torr and wherein the GaP and $ZnP_2$ are heated to a temperature of between 800° and 875° C., the temperature of said $ZnP_2$ being from 5°–10° C. below the temperature of said GaP.

8. The process recited in claim 7 wherein said N type GaP is epitaxially grown selenium doped GaP.

* * * * *

UNITED STATES PATENT OFFICE
CERTIFICATE OF CORRECTION

Patent No. 3,653,989 Dated April 4, 1972

Inventor(s) Alois Erhard Widmer

It is certified that error appears in the above-identified patent and that said Letters Patent are hereby corrected as shown below:

In the title, "ZN" should read --Zn-- and "GAP" should read --GaP--. In Column 2, line 19, "then" should read --than--; line 25, delete "b" after "about"; line 67, delete "junction" and insert --$ZnP_2$--.

Signed and sealed this 1st day of August 1972.

(SEAL)
Attest:

EDWARD M.FLETCHER,JR.
Attesting Officer

ROBERT GOTTSCHALK
Commissioner of Patents